(12) United States Patent
Phee et al.

(10) Patent No.: US 11,728,197 B2
(45) Date of Patent: Aug. 15, 2023

(54) WAFER TO WAFER BONDING APPARATUS AND WAFER TO WAFER BONDING METHOD

(71) Applicant: SAMSUNG ELECTRONICS CO., LTD., Suwon-si (KR)

(72) Inventors: Jaehyun Phee, Incheon (KR); Hoechul Kim, Seoul (KR); Seokho Kim, Hwaseong-si (KR); Taeyeong Kim, Yongin-si (KR); Hoonjoo Na, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 17/218,606

(22) Filed: Mar. 31, 2021

(65) Prior Publication Data
US 2022/0020624 A1 Jan. 20, 2022

(30) Foreign Application Priority Data
Jul. 14, 2020 (KR) .................. 10-2020-0086690

(51) Int. Cl.
*H01L 21/68* (2006.01)
*H01L 21/67* (2006.01)
*H01L 21/683* (2006.01)

(52) U.S. Cl.
CPC ...... *H01L 21/681* (2013.01); *H01L 21/67092* (2013.01); *H01L 21/6838* (2013.01)

(58) Field of Classification Search
CPC ............. H01L 21/67092; H01L 21/681; H01L 21/6838
See application file for complete search history.

(56) References Cited

U.S. PATENT DOCUMENTS

| 4,291,334 A * | 9/1981 | Mese | ............... H01L 21/681 348/94 |
| 6,258,495 B1 | 7/2001 | Okamura et al. | |
| 9,299,620 B2 * | 3/2016 | Horikoshi | ............... H01L 21/68 |
| 9,646,860 B2 | 5/2017 | Huang et al. | |

(Continued)

FOREIGN PATENT DOCUMENTS

| JP | 3316676 B2 | 8/2002 |
| JP | 2005-116966 A | 4/2005 |

(Continued)

*Primary Examiner* — Sonya M Sengupta
(74) *Attorney, Agent, or Firm* — Lee IP Law, P.C.

(57) ABSTRACT

A wafer bonding apparatus including a first stage having a first surface and being configured to hold a first wafer on the first surface; a second stage having a second surface and being configured to hold a second wafer on the second surface facing the first surface; a first target image sensor on an outer portion of the first stage; a second target image sensor on an outer portion of the second stage; and a target portion on the first or second stage, the target portion having a target plate fixedly installed and spaced apart from the first or second target image sensor by a predetermined distance, wherein, in an alignment measurement of the first and second stages, the first and second stages are movable so that the first and second target image sensors face each other and the target plate is between the first and second target image sensors.

19 Claims, 14 Drawing Sheets

(56) References Cited

U.S. PATENT DOCUMENTS

| | | | | |
|---|---|---|---|---|
| 2003/0133762 A1* | 7/2003 | Yamamoto | .......... | H01L 21/6838 |
| | | | | 406/198 |
| 2007/0020871 A1* | 1/2007 | Chen | .................... | H01L 21/681 |
| | | | | 438/401 |
| 2017/0221856 A1* | 8/2017 | Yamauchi | ......... | H01L 21/67092 |
| 2017/0278803 A1* | 9/2017 | Sugaya | .................. | B23K 20/24 |
| 2019/0189593 A1 | 6/2019 | Kim et al. | | |
| 2020/0020553 A1 | 1/2020 | Otsuka et al. | | |

FOREIGN PATENT DOCUMENTS

| | | | |
|---|---|---|---|
| JP | 3719965 | B2 | 11/2005 |
| JP | 6478939 | B2 | 3/2019 |
| KR | 10-0553812 | B1 | 2/2006 |

\* cited by examiner

WAFER TO WAFER BONDING APPARATUS AND WAFER TO WAFER BONDING METHOD

CROSS-REFERENCE TO RELATED APPLICATION

Korean Patent Application No. 10-2020-0086690, filed on Jul. 14, 2020, in the Korean Intellectual Property Office, and entitled: "Wafer to Wafer Bonding Apparatus and Wafer to Wafer Bonding Method," is incorporated by reference herein in its entirety.

BACKGROUND

1. Field

Embodiments relate to a wafer bonding apparatus and a wafer to wafer bonding method.

2. Description of the Related Art

In manufacturing electronic products such as CIS (CMOS image sensor), HBM (High Bandwidth Memory), etc., two wafers may be bonded to each other, thereby improving a yield rate per wafer.

SUMMARY

The embodiments may be realized by providing a wafer bonding apparatus including a first stage having a first surface, the first stage being configured to hold a first wafer on the first surface; a second stage having a second surface, the second stage being configured to hold a second wafer on the second surface, the first surface and the second surface facing each other; a first target image sensor on an outer portion of the first stage; a second target image sensor on an outer portion of the second stage; and a target portion on the first stage or the second stage, the target portion having a target plate fixedly installed and spaced apart from the first target image sensor or the second target image sensor by a predetermined distance, wherein, in an alignment measurement of the first stage and the second stage, the first stage and the second stage are movable so that the first target image sensor and the second target image sensor face each other and the target plate is between the first target image sensor and the second target image sensor facing each other.

The embodiments may be realized by providing a wafer bonding apparatus including a first stage configured to suction a first wafer; a second stage configured to suction a second wafer; a stage driver configured to move the first stage and the second stage relative to each other; a first mark image sensor on an outer portion of the first stage, the first mark image sensor being configured to image a second alignment mark on the second wafer; a second mark image sensor on an outer portion of the second stage, the second mark image sensor being configured to image a first alignment mark on the first wafer; a target image sensor on the outer portion of the first stage adjacent to the first mark image sensor; and a target portion on the outer portion of the first stage, the target portion having a target plate arranged above the target image sensor and spaced apart from the target image sensor by a predetermined distance, wherein in an alignment measurement of the first stage and the second stage, the first stage and the second stage are movable so that the target image sensor and the second mark image sensor face each other and the target plate is between the target image sensor and the second mark image sensor facing each other, and each of a first distance between the target plate and the target image sensor and a second distance between the target plate and the second mark image sensor is within a range of 5 mm to 15 mm.

The embodiments may be realized by providing a wafer bonding apparatus including a first stage configured to suction a first wafer; a second stage configured to suction a second wafer; a stage driver configured to move the first stage and the second stage relative to each other; a first mark image sensor on an outer portion of the first stage, the first mark image sensor being configured to image a second alignment mark on the second wafer; a second mark image sensor on an outer portion of the second stage, the second mark image sensor being configured to image a first alignment mark on the first wafer; a target image sensor in the outer portion of the first stage adjacent to the first mark image sensor; a target portion on the outer portion of the first stage, the target portion having a target plate arranged above the target image sensor and spaced apart from the target image sensor by a predetermined distance; a push rod that is movable upwardly and downwardly through a center hole in a middle portion of at least one of the first stage and the second stage to press a middle region of the first wafer or the second wafer; and a push rod driver configured to move the push rod upwardly and downwardly, wherein, in an alignment measurement of the first stage and the second stage, the first stage and the second stage are movable so that the target image sensor and the second mark image sensor face each other and the target plate is between the target image sensor and the second mark image sensor facing each other.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
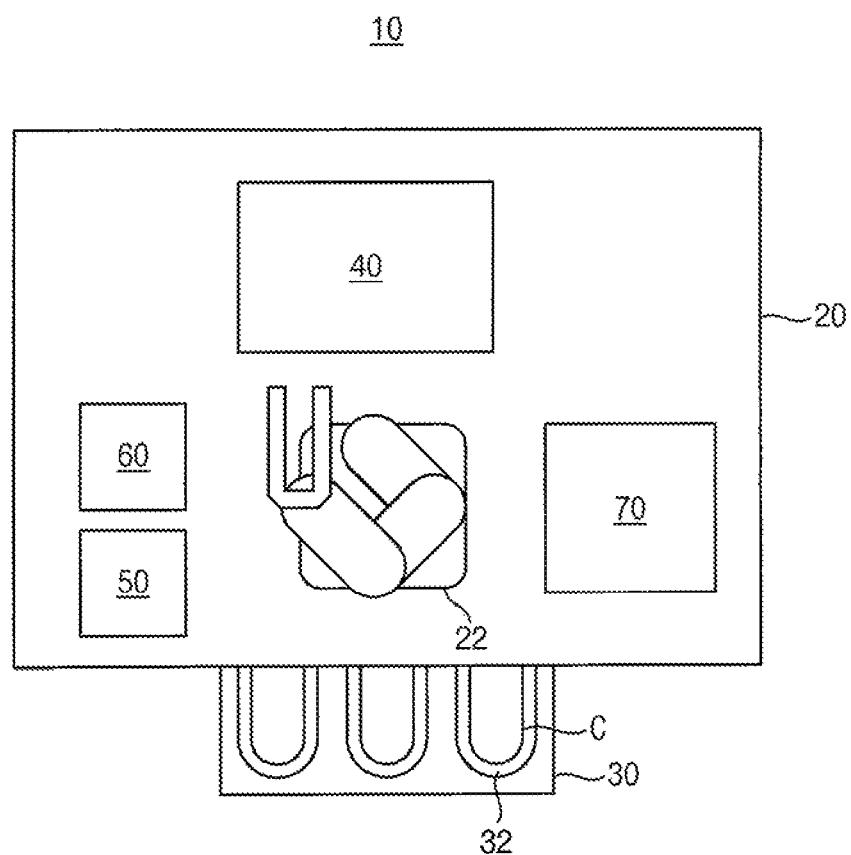
FIG. 1 is a block diagram of a wafer to wafer bonding system according to exemplary embodiments.

FIG. 1 is a block diagram of a wafer to wafer bonding system according to exemplary embodiments.

Referring to FIG. 1, a wafer to wafer bonding system 10 may include a pre-treatment apparatus such as a plasma processing apparatus 40 and a cleaning apparatus 50, an aligning apparatus 60, and a wafer bonding apparatus 70 arranged in a clean room 20. The wafer to wafer bonding system 10 may further include a cassette stage 30 in a side of the clean room 20.

In an implementation, the clean room 20 may be an enclosed room having a cuboid shape, and may be a controlled environment that has a low level of pollutants, e.g., dust, airborne microbes, aerosol particles, and chemical vapors.

The cassette stage 30 may provide a space in which wafers are located before being transferred into the clean room 20. A carrier C having a plurality of the wafers received therein may be supported on a support plate 32 of the cassette stage 30. The carrier C may be, e.g., a front opening unified pod (FOUP). The wafers received in the carrier C may be transferred into the clean room 20 by a transfer robot 22. In an implementation, three carriers C may be on the cassette stage 30. In an implementation, first and second wafers to be bonded to each other may be received in first and second carriers C respectively, and bonded wafers may be received in a third carrier C.

In an implementation, the first wafer may be a wafer in which circuits for an image sensor chip are formed, and the second wafer may be a wafer in which photosensors for the image sensor chip are formed. In an implementation, the first wafer may be a wafer in which circuits for a semiconductor package such as High Band Memory (HBM) are formed, and the second wafer may be a wafer in which memories for the semiconductor package are formed.

The plasma processing apparatus 40 may perform a plasma treatment on a surface of the wafer W. The plasma processing apparatus 40 may be an apparatus configured to process plasma on the surface of the wafer W within an ICP (inductively coupled plasma) chamber to form a dangling bond on the surface of the wafer W. In an implementation, exemplary embodiments may utilize capacitively coupled plasma, microwave plasma, etc., which may be generated by the plasma processing apparatus.

The cleaning apparatus 50 may clean the surface of the wafer that has been plasma-processed by the plasma processing apparatus 40. The cleaning apparatus 50 may coat deionized (DI) water on the wafer surface using a spin coater. The DI water may clean the wafer surface and allow —OH radical to be bonded easily on the wafer surface, such that dangling bonds are easily created on the wafer surface.

The aligning apparatus 60 may detect a flat portion (or notch portion) of the wafer W to align the wafer W. The wafer aligned by the aligning apparatus 60 may be transferred to the plasma processing apparatus 40 or the wafer bonding apparatus 70 by the transfer robot 22. The aligning apparatus 60 may be a loading unit for loading the aligned wafer into the wafer bonding apparatus 70.

Hereinafter, the wafer bonding apparatus of FIG. 1 will be explained.

Figure 2:
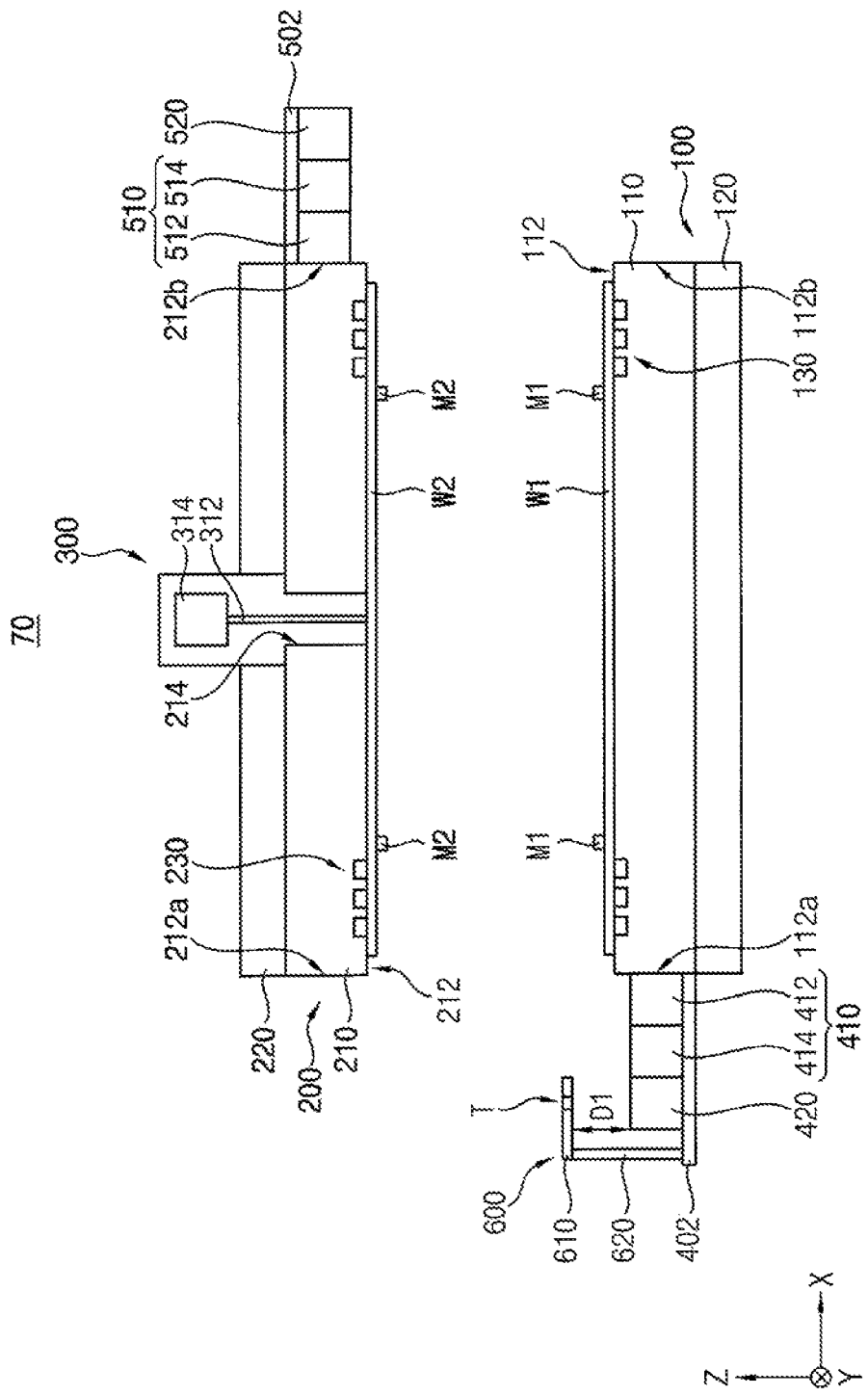
FIG. 2 is a cross-sectional view of a wafer bonding apparatus in accordance with example embodiments.
Figure 3:
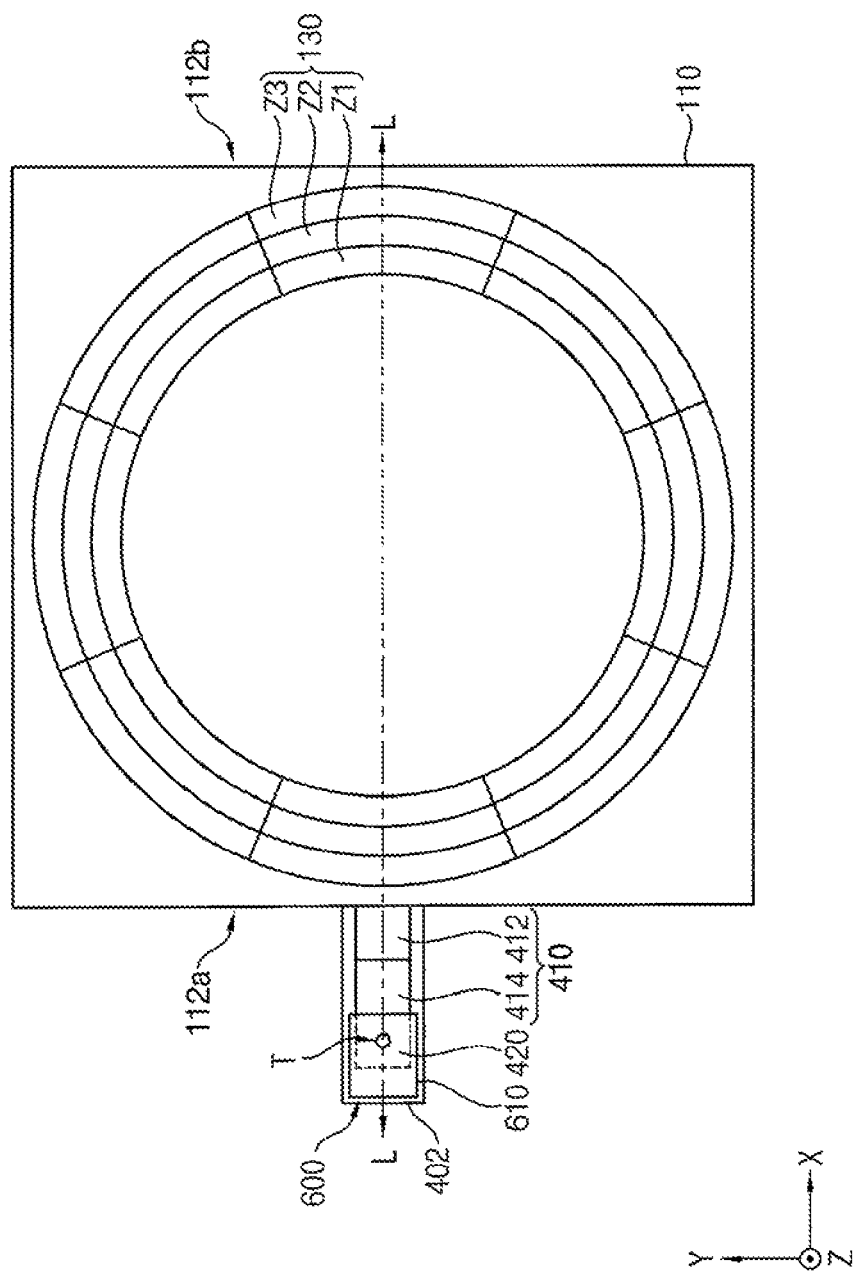
FIG. 3 is a plan view of a first stage of the wafer bonding apparatus of FIG. 2.
Figure 4:
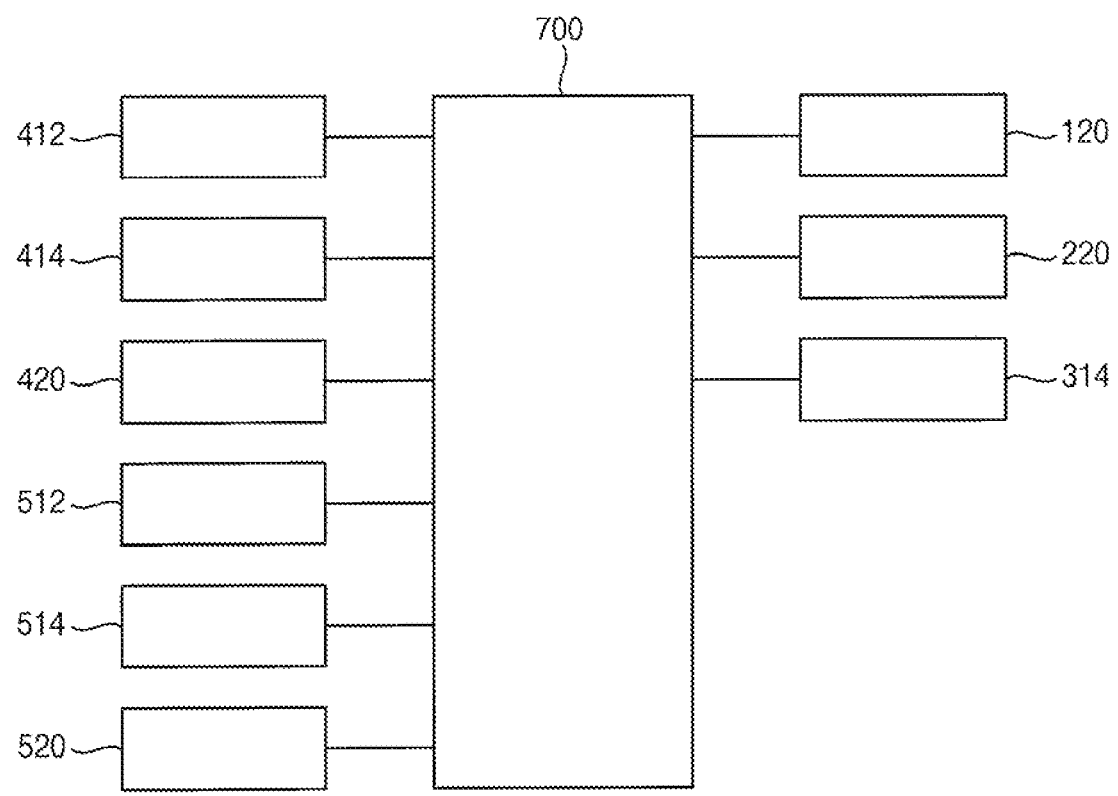
FIG. 4 is a block diagram of a sensor, drivers, and a controller of the wafer bonding apparatus of FIG. 2.

FIG. 2 is a cross-sectional view of a wafer bonding apparatus in accordance with example embodiments. FIG. 3 is a plan view of a first stage of the wafer bonding apparatus in FIG. 2. FIG. 4 is a block diagram of a sensor, drivers, and a controller of the wafer bonding apparatus in FIG. 2.

Referring to FIGS. 2 to 5, a wafer bonding apparatus 70 may include a lower chuck structure 100, an upper chuck structure 200, a wafer pusher 300, and an imaging unit or image sensor. In an implementation, the wafer bonding apparatus 70 may further include a plurality of drivers and a controller 700 configured to control operations of the drivers.

In an implementation, the lower chuck structure 100 may include a first stage 110 that holds a first wafer W1. The first stage 110 may have a first surface 112 on which the first wafer W1 is disposed. First suction holes 130 may be in the first surface 112 of the first stage 110. The first wafer W1 may be vacuum suctioned (e.g., vacuum held) by the first suction holes 130 of the first stage 110.

The upper chuck structure 200 may include a second stage 210 that holds a second wafer W2. The second stage 210 may be arranged to face the first stage 110. The second stage 210 may have a second surface 212 on which the second wafer W2 is disposed. Second suction holes 230 may be in the second surface 212 of the second stage 210. The second wafer W2 may be vacuum suctioned by the second suction holes 230 of the second stage 210.

The first suction holes 130 of the first stage 110 and the second suction holes 230 of the second stage 210 may be arranged to correspond to each other. In an implementation, the first suction holes 130 and the second suction holes 230 may be arranged mirror-symmetrically to each other (e.g., may be vertically aligned along a Z direction).

As illustrated in FIG. 3, the first suction holes 130 may be arranged in a peripheral region of the first stage 110 to provide an outer suction region. The first suction holes 130 may suction a peripheral portion of the first wafer W2. In an implementation, inner suction holes may be additionally included in a middle region of the first stage 110 to provide an inner suction region. The second suction holes 230 may correspond to the first suction holes 130, and a detailed explanation concerning the second suction holes 230 may be omitted.

The first suction holes 130 may have a first suction portion Z1, a second suction portion Z2 and a third suction portion Z3 arranged sequentially in a radial direction from a center (e.g., outwardly). In an implementation, each of the first to third suction portions Z1, Z2, Z3 may include eight segments of an arch shape to have an entirely annual form. In an implementation, each of the first to third suction portions may have eight arch-shaped segments. In an implementation, the suction portion may have 8 to 64 arch-shaped segments, e.g., 16, 32, 64, etc.

Each of the first to third suction portions Z1, Z2, Z3 having the annular shape may include a plurality of recesses having an arch shape. In an implementation, each of the first to third suction portions Z1, Z2, Z3 may have eight recesses of an arch shape. One recess may have a central angle of about 45 degrees.

The first to third suction portions Z1, Z2, Z3 may be connected to a vacuum pump through pipe lines respectively. In an implementation, vacuum pressure may be supplied independently or by group (e.g., arch-shaped recesses opposite to each other) to eight arch-shaped segments of the first suction portion Z1.

The suction pump may be connected to and controlled by the controller 700 to supply the vacuum pressure to the first to third suction portions Z1, Z2, Z3. In an implementation, the suction pump may supply the vacuum pressure to each of the recesses of the first to third suction portions Z1, Z2, Z3. In an implementation, the first and second wafers W1, W2 may be held using electrostatic force such as an electrostatic chuck.

In an implementation, the wafer bonding apparatus 70 may further include a stage driver configured to move the first stage 110 and the second stage 210 relative to each other.

In an implementation, the lower chuck structure 100 may include a first stage driver 120 that moves the first stage 110. The first stage driver 120 may include a horizontal driver to move translationally the first stage 110 in X, Y, Z directions and a rotational driver to rotate the first stage 110 about Z axis.

The first stage 110 may be movable translationally and rotationally by the first stage driver 120 such that a relative position between the second stage 210 and the first stage 110 may be adjusted.

The upper chuck structure 200 may include a second stage driver 220 which moves the second stage 210. The second stage driver 220 may perform similar functions as the first stage driver 120.

In an implementation, the wafer pusher 300 may include an upper push rod 312 and an upper push rod driver 314.

The upper push rod driver 314 may be connected to and controlled by the controller 700 and may move the upper push rod 312 upwardly and downwardly (e.g., in the Z direction). The upper push rod 312 may be movable through a center hole 214 in the middle portion of the second stage 210. The upper push rod 312 may move downwardly by the upper push rod driver 314 to press a middle region of the second wafer W2. The upper push rod driver 314 may include a driving source such as a hydraulic cylinder, a pneumatic cylinder, a linear motor, a solenoid device, etc.

In an implementation, the wafer bonding apparatus 70 may further include a lower push rod in the first stage 110 to press a middle region of the first wafer W1 upwardly and a lower push rod driver to move the lower push rod.

In an implementation, the image sensor may include an alignment mark image sensor for wafer alignment measurement and a target image sensor for stage alignment measurement.

In an implementation, the alignment mark image sensor may include a first mark image sensor 410 in or on an outer portion of the first stage 110 and configured to image (e.g., capture an image of or otherwise sense a position of) a second alignment mark M2 on the second wafer W2, and a second mark image sensor 510 in or on an outer portion of the second stage 210 and configured to image a first alignment mark M1 on the first wafer W1. The first mark image sensor 410 may include a first macro camera 412 and a first micro camera 414. The second mark image sensor 510 may include a second macro camera 512 and a second micro camera 514.

As illustrated in FIG. 3, the first mark image sensor 410 may be at a first outer portion 112a of the first stage 110. A first base plate 402 may be fixedly installed on the first outer portion 112a of the first stage 110, and the first macro camera 412 and the first micro camera 414 may be fixedly installed on the first base plate 402. The first macro camera 412 and the first micro camera 414 of the first mark image sensor 410 may be arranged sequentially along a line L that passes through the center of the first stage 110 from the first outer portion 112a of the first stage 110 (e.g., in the X direction).

The second mark image sensor 510 may be on a side of the second stage 210 opposite to the first mark image sensor 410 with respect to the center of the stage when viewed in a plan view. The second mark image sensor 510 may be on a fourth outer portion 212b of the second stage 210 aligned (along the Z direction) with a second outer portion 112b of the first stage 110 and that is opposite to a third outer portion 212a that corresponds to (e.g., aligned with) the first outer portion 112a of the first stage 110. A second base plate 502 may be fixedly installed on the fourth outer portion 212b of the second stage 210, and the second macro camera 512 and the second micro camera 514 may be fixedly installed on the second base plate 502. The second macro camera 512 and the second micro camera 514 of the second mark image sensor 510 may be arranged sequentially along a line that passes through the center of the second stage 210 from the fourth outer portion 212b of the second stage 210 (in the X direction).

The first mark image sensor 410 may image the second alignment mark M2 on the surface of the second wafer W2. The first macro camera 412 may be a wide-area camera with a wide-area objective lens, and the first micro camera 414 may be a local camera with an objective lens having a higher magnification than the first macro camera 412. The first macro camera 412 may capture an image of the surface of the second wafer W2 in a relatively wide range. The first micro camera 414 may capture an image with higher accuracy than the first macro camera 412.

The second mark image sensor 510 may image the first alignment mark M1 on the surface of the first wafer W1. The second macro camera 512 may be a wide-area camera with a wide-area objective lens, and the second micro camera 514 may be a local camera with an objective lens having a higher magnification than the second macro camera 512. The second macro camera 512 may capture an image of the surface of the first wafer W1 in a relatively wide range. The second micro camera 514 may capture an image with higher accuracy than the second macro camera 512.

In order to perform the alignment measurement of the second wafer W2, the first mark image sensor 410 may move below the second stage 210 together with the first stage 110 to image the second alignment mark M2 on the second wafer W2. In order to perform the alignment measurement of the first wafer W1, the second mark image sensor 510 may move above the first stage 110 together with the second stage 210 to image the first alignment mark M1 on the first wafer W1.

The target image sensor may include a first target image sensor 420 on an outer portion of the first stage 110, a second target image sensor 520 on an outer portion of the second stage 210, and a target portion 600 on at least one of the first and second stages 110, 210 and having a target plate 610 fixedly installed to be spaced apart from the first target image sensor 420 or the second target image sensor 520 by a predetermined distance.

The first target image sensor 420 may be on the first outer portion 112a of the first stage 110. The first target image sensor 420 may be fixedly installed on the first base plate 402 adjacent to the first mark image sensor 410. The first target image sensor 420 may be farther from the first outer portion 112a of the first stage 110 than the first mark image sensor 410 (e.g., in the X direction). The second target image sensor 520 may be on the fourth outer portion 212b of the second stage 210. The second target image sensor 520 may be fixedly installed on the second base plate 502 adjacent to the second mark image sensor 510. The second target image sensor 520 may be farther from the fourth outer portion 212b of the second stage 210 than the second mark image sensor 510 (e.g., in the X direction).

As illustrated in FIGS. 2 and 3, the target portion 600 may be fixedly installed in or on the first stage 110. The target portion 600 may include (e.g., an outer part of) the first base plate 402 extending outwardly from the first outer portion 112a of the first stage 110, a support plate 620 extending (e.g., lengthwise) in a vertical direction (Z direction) from the first base plate 402, and the target plate 610 fixed to the support plate 620 and extending (e.g., lengthwise) in a horizontal direction (X direction).

The target plate 610 may include an alignment target T in a plane (XY plane) parallel to the first surface 112 of the first stage 110 and the second surface 212 of the second stage 210. The target plate 610 may be fixedly installed above the first target image sensor 420 to be spaced apart from the first target image sensor 420 by a predetermined distance D1. In an implementation, an optical axis of an objective lens of the first target image sensor 420 may extend in the vertical direction (Z direction) to pass through a center of the alignment target T. In an implementation, the distance D1 between the target plate 610 and the first target image sensor 420 may be within a range of 5 mm to 15 mm.

In order to perform the alignment measurement of the first and second stages 110 and 210, the first and second stages 110 and 210 may be movable so that the first target image sensor 420 and the second target image sensor 520 face each other and the target plate 610 is positioned between the first target image sensor 420 and the second target image sensor 520 facing each other. In the alignment measurement of the first and second stages 110 and 210, the first target image sensor 420 may image the alignment target T under the target plate 610 and the second target image sensor 520 may image the alignment target T above the target plate 610.

The first and second mark image sensors 410, 510 may image the first and second alignment marks M1, M2 and output position information of the first and second wafers W1, W2 to the controller 700. The first and second target image sensors 420, 520 may image the alignment target T and output position information of the first and second stages 110, 210 to the controller 700. The controller 700 may control operations of the first and second stages 110, 210 based on the alignment results of the first and second wafers W1, W2 and the alignment results of the first and second stages 110, 210.

As illustrated in FIG. 4, the controller 700 may be connected to elements of the wafer bonding apparatus 70 described previously with reference to FIG. 2 to control operations thereof. The controller 700 may receive the position information from the image sensor and align the first and second wafers W1, W2 and the first and second stages 110, 210 based on the position information. The controller 700 may apply driving control signals to the drivers such as the first stage driver 120, the second stage driver 220 and the upper push rod driver 314 to control the operation of the wafer bonding apparatus 70.

As mentioned above, the wafer bonding apparatus 70 may include the target image sensor for alignment measurement of the first and second stages 110, 210. The target image sensor may include the first target image sensor 420 in the outer portion of the first stage 110, the second target image sensor 520 in the outer portion of the second stage 210, and the target portion 600 in the at least one of the first and second stages 110, 210 and having the target plate 610 fixedly installed to be spaced apart from the first target image sensor 420 or the second target image sensor 520 by the predetermined distance.

In the alignment measurement of the first and second stages 110 and 210, the first and second stages 110 and 210 may be movable so that the first target image sensor 420 and the second target image sensor 520 face each other and the target plate 610 is positioned between the first target image sensor 420 and the second target image sensor 520 facing each other. The first target image sensor 420 and second target image sensor 520 may image the alignment target T of the target plate 610 to obtain the position information of the first and second stages 110, 210 and the positions of the first and second stages 110, 210 may be aligned based on the position information.

In an implementation, the target plate 610 may be fixedly installed in the outer portion of the first stage 110 or the second stage, and the first target image sensor 420 and the second target image sensor 520 may image the alignment target T of the target plate 610 therebetween to accurately measure a position error between the first and second stages 110, 210, to thereby minimize an alignment error between the wafers in wafer bonding.

Hereinafter, a wafer to wafer bonding method using the wafer bonding apparatus in FIG. 2 will be described.

Figure 5:
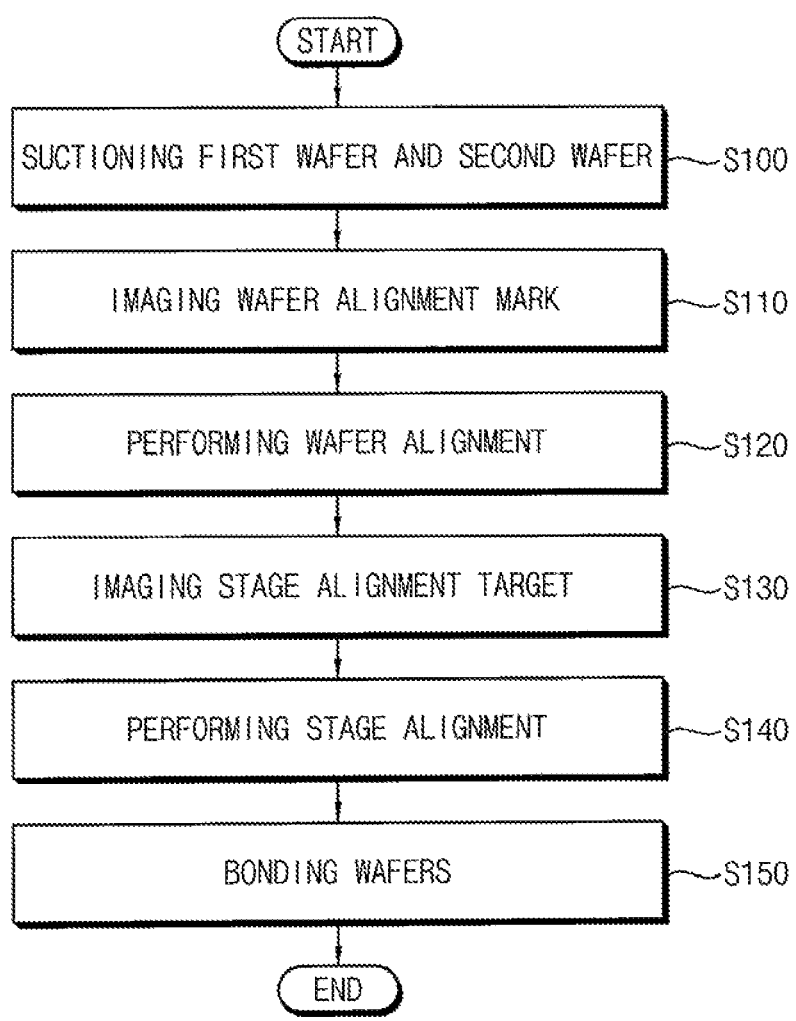
FIG. 5 is a flowchart of a wafer to wafer bonding method in accordance with example embodiments.
Figure 10:
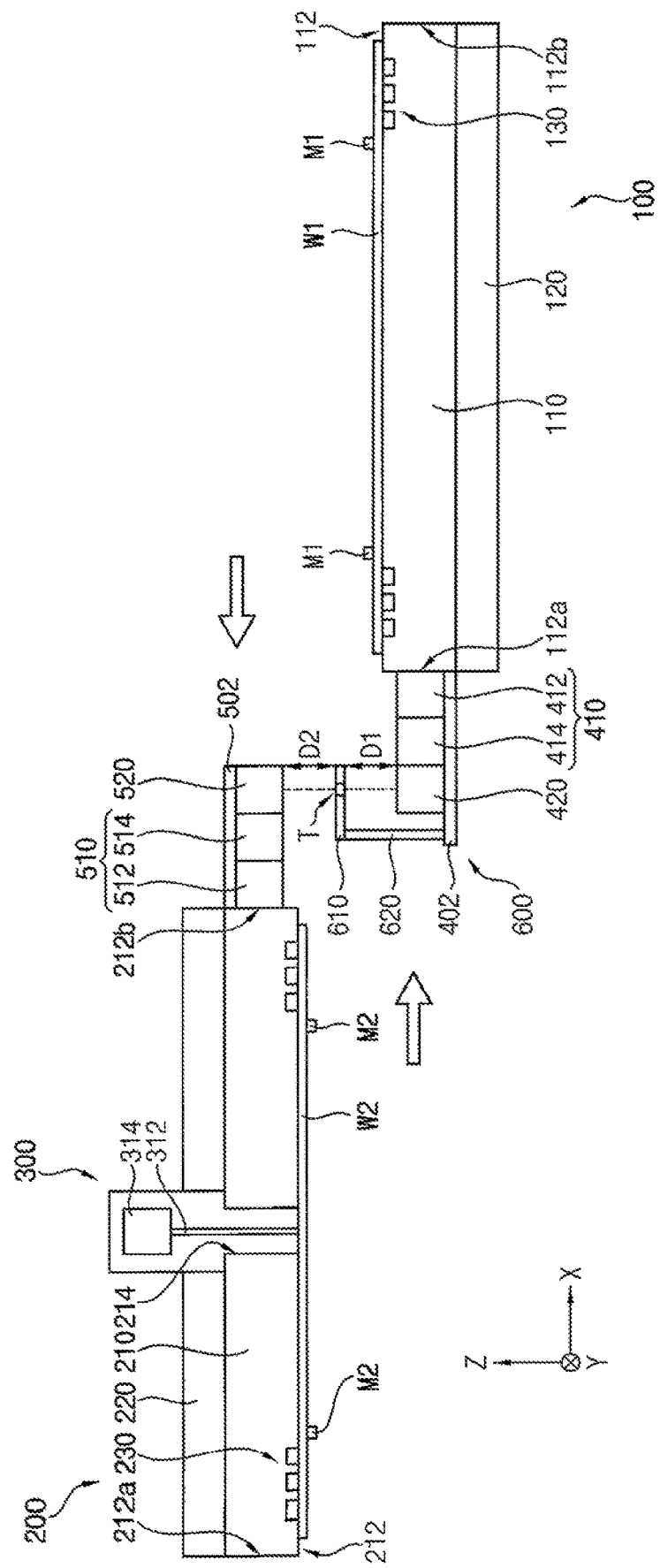
FIG. 10 is a cross-sectional view illustrating a step of imaging a stage alignment target in the wafer to wafer bonding method in FIG. 5.
Figure 11:
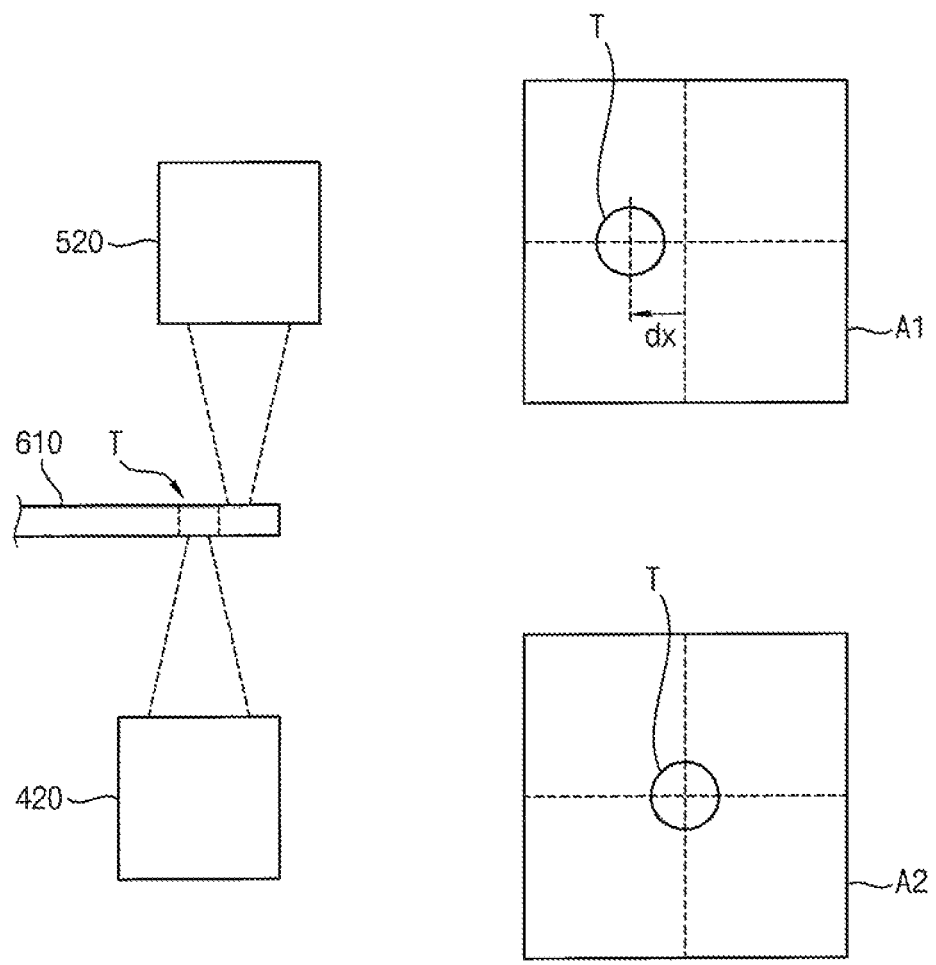
FIG. 11 illustrates views of images obtained in the step of imaging the stage alignment target in FIG. 10.
Figure 12:
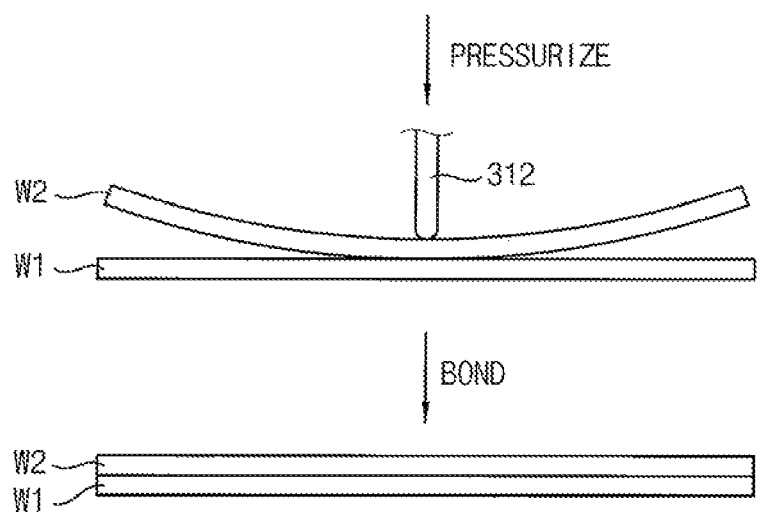
FIG. 12 is a view of a step of bonding wafers in the wafer to wafer bonding method in FIG. 5.

FIG. 5 is a flowchart illustrating a wafer to wafer bonding method in accordance with example embodiments. FIGS. 6 to 9 are cross-sectional views illustrating a step of imaging a wafer alignment mark in the wafer to wafer bonding method in FIG. 5. FIG. 10 is a cross-sectional view illustrating a step of imaging a stage alignment target in the wafer to wafer bonding method in FIG. 5. FIG. 11 is views illustrating images obtained in the step of imaging the stage alignment target in FIG. 10. FIG. 12 is a view illustrating a step of bonding wafers in the wafer to wafer bonding method in FIG. 5.

Referring to FIG. 5, first, first and second wafers W1, W2 may be suctioned to be held by a first stage 110 and a second stage 210 of a wafer bonding apparatus respectively (S100).

For example, the first wafer W1 may be vacuum suctioned by first suction holes 130 of the first stage 110. The second wafer W2 may be vacuum suctioned by second suction holes 230 of the second stage 210.

Then, a wafer alignment mark may be imaged (S110), and then, a wafer alignment may be performed (S120).

Figure 6:
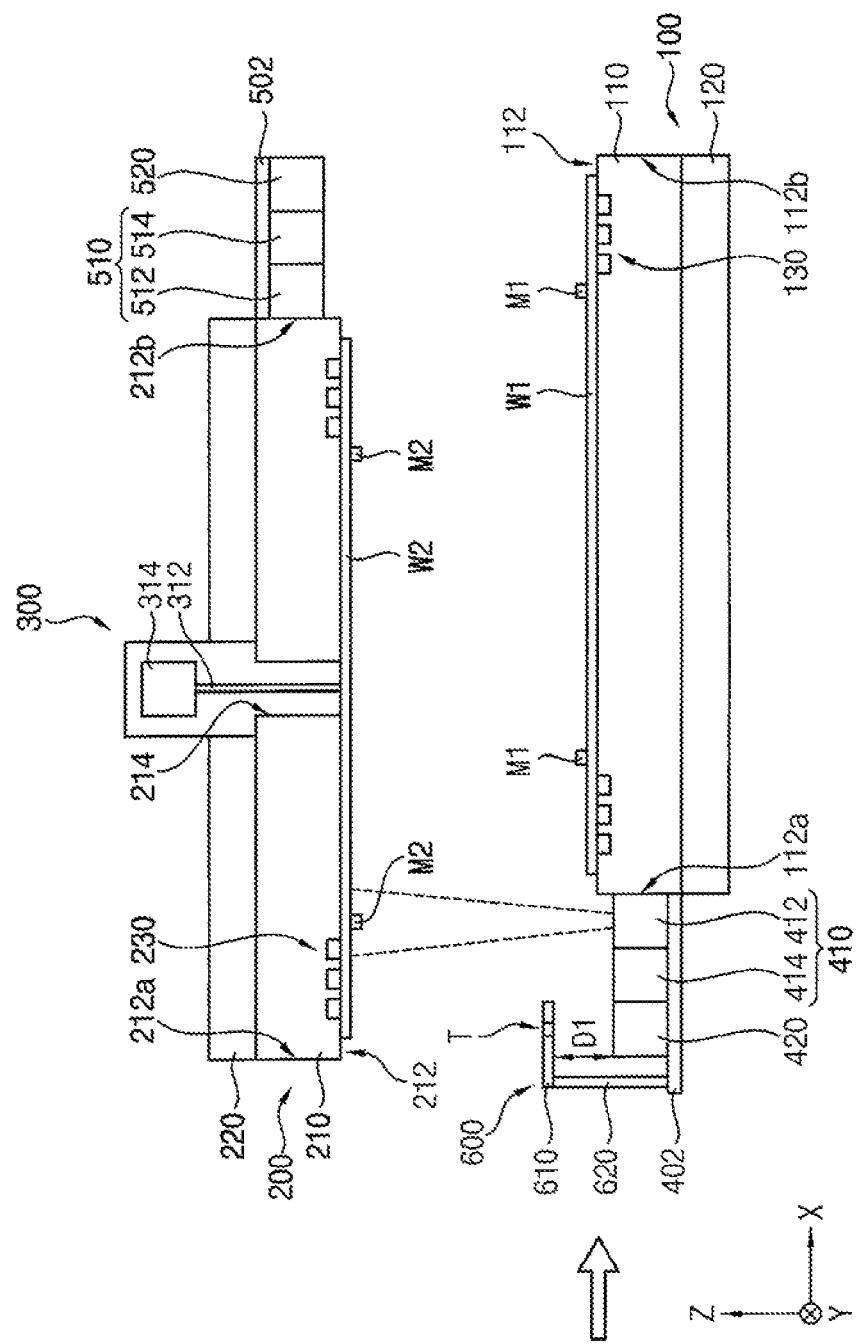
FIGS. 6 to 9 are cross-sectional views of a step of imaging a wafer alignment mark in the wafer to wafer bonding method in FIG. 5.
Figure 7:
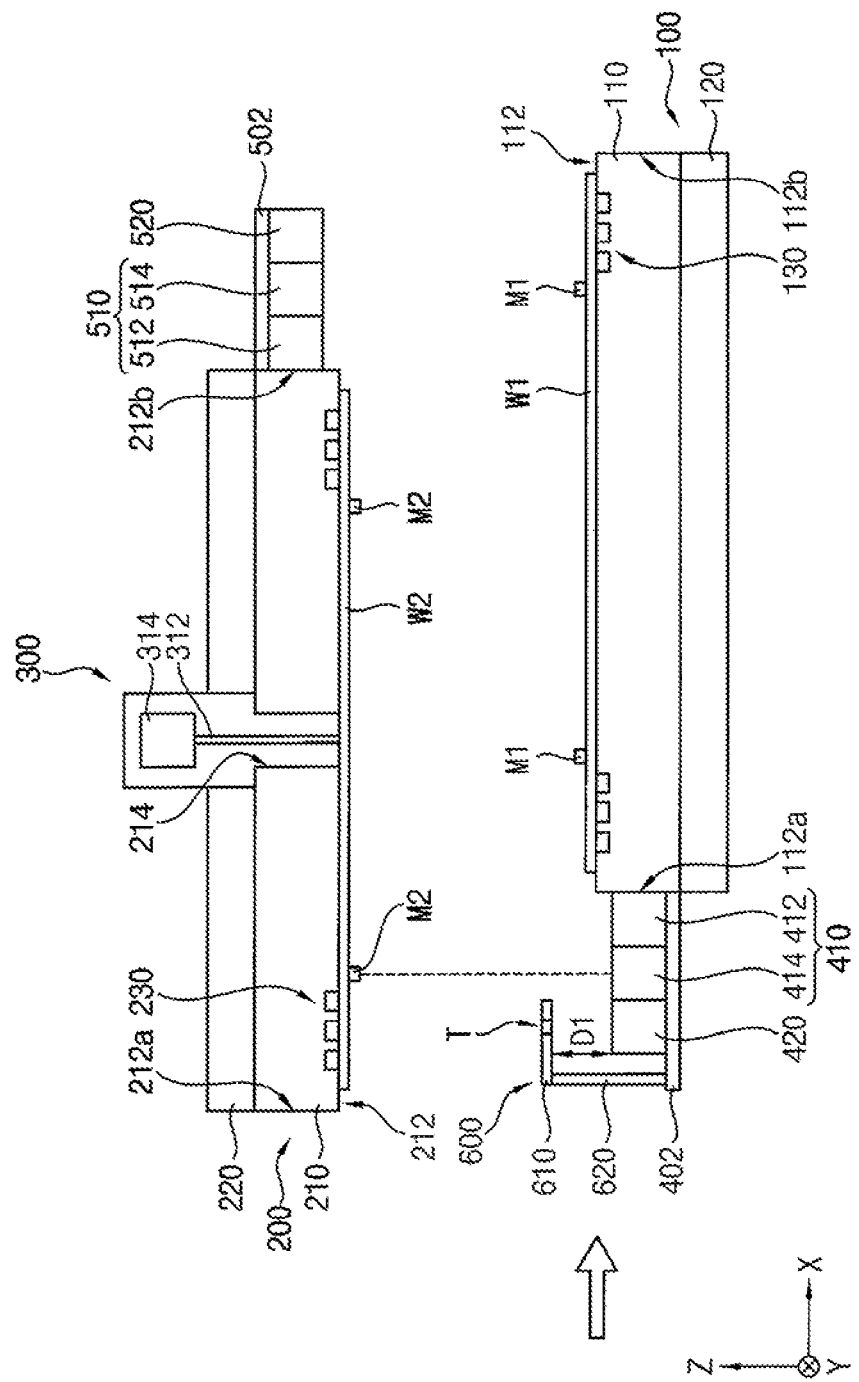

As illustrated in FIGS. 6 and 7, in order to perform an alignment measurement of the second wafer W2, the first mark image sensor 410 may move below the second stage 210 to image the second alignment mark M2 on the second wafer W2.

In an implementation, as the first stage 110 moves in a first direction (X direction) by the first stage driver 120, the first macro camera 412 may be moved to a position of the second alignment mark M2. Then, the first macro camera 412 may image the second alignment mark M2 of the second wafer W2, and a pre-alignment of the second wafer W2 may be performed based on the imaging result of the first macro camera 412.

Then, as the first stage 110 moves in the first direction (X direction) by the first stage driver 120, the first micro camera 414 may be moved to a position of the second alignment mark M2 detected by the first macro camera 412. Then, the first micro camera 414 may image the second alignment mark M2 of the second wafer W2, and a fine-alignment of the second wafer W2 may be performed based on the imaging result of the first micro camera 414.

Figure 8:
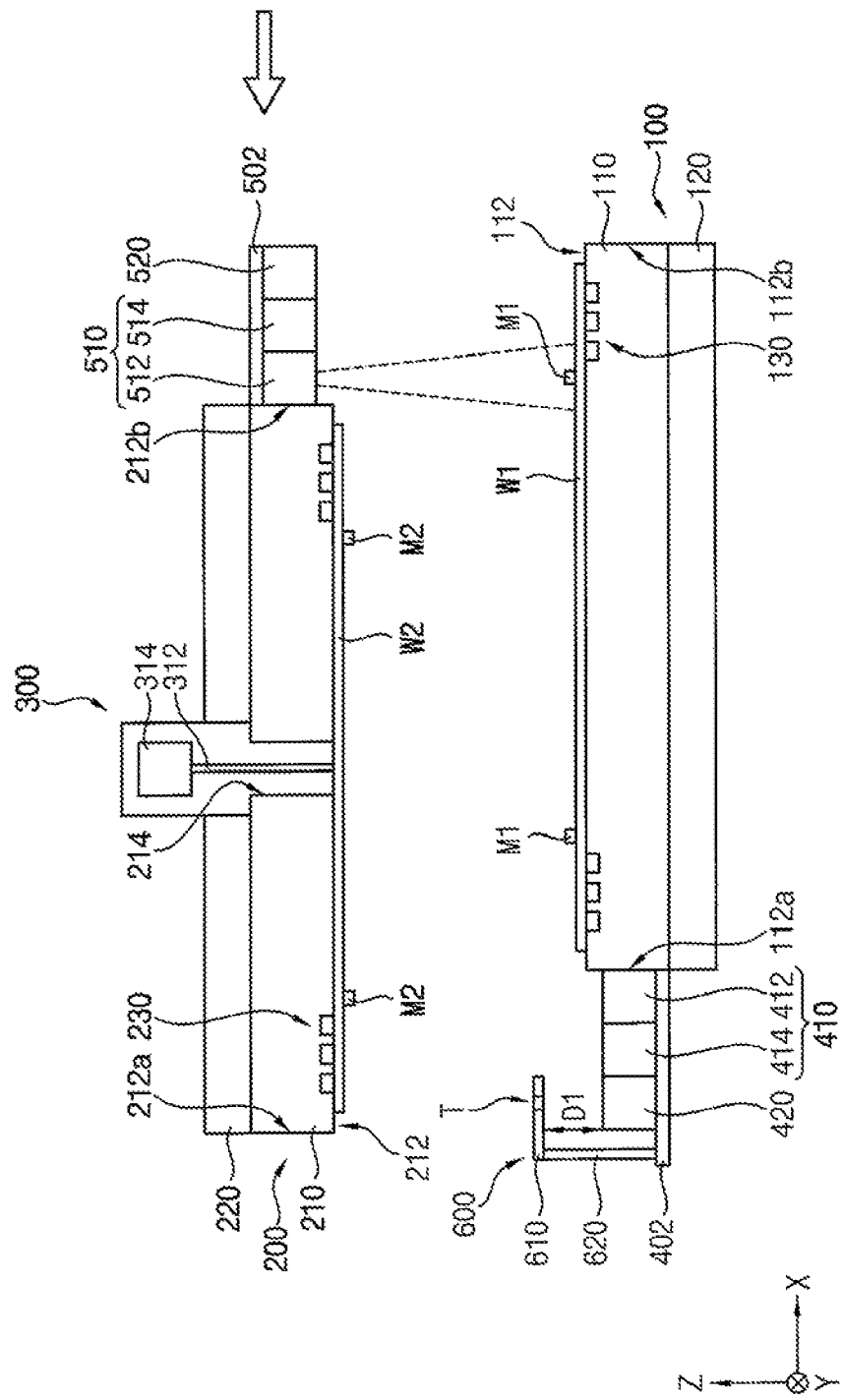
Figure 9:
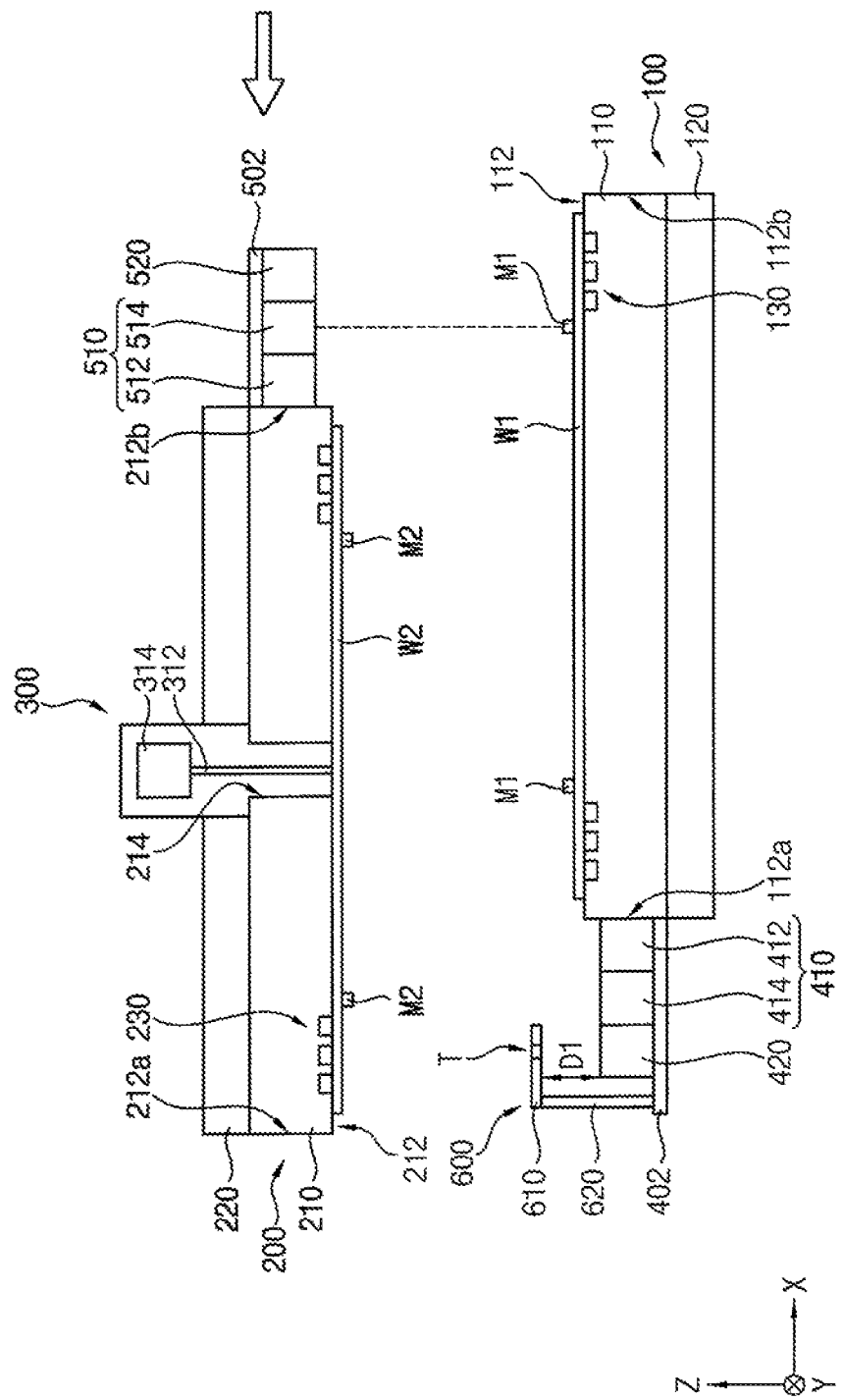

As illustrated in FIGS. 8 and 9, in order to perform an alignment measurement of the first wafer W1, the second mark image sensor 510 may move above the first stage 110 to image the first alignment mark M1 on the first wafer W1.

In an implementation, as the second stage 210 moves in a second direction (−X direction) by the second stage driver 220, the second macro camera 512 may be moved to a position of the first alignment mark M1. Then, the second macro camera 512 may image the first alignment mark M1 of the first wafer W1, and a pre-alignment of the first wafer W1 may be performed on the imaging result of the second macro camera 512.

Then, as the second stage 210 moves in the second direction (−X direction) by the second stage driver 220, the second micro camera 514 may be moved to a position of the first alignment mark M1 detected by the second macro camera 512. Then, the second micro camera 514 may image the first alignment mark M1 of the first wafer W1, and a fine-alignment of the first wafer W1 may be performed on the imaging result of the second micro camera 514.

Then, a stage alignment target may be imaged (S130), and then, a stage alignment may be performed (S140).

As illustrated in FIG. 10, the first and second stages 110, 210 may move relative to each other such that the first and second target image sensors 420, 520 face each other. The second target image sensor 520 may move to a predetermined imaging position as a position of an alignment target T provided in the target plate 610. In an implementation, the target plate 610 may be positioned between the first target image sensor 420 and the second target image sensor 520.

In an implementation, the first distance D1 between the target plate 610 and the first target image sensor 420 and a second distance D2 between the target plate 610 and the second target image sensor 520 may be within a range of 5 mm to 15 mm. In an implementation, the first distance D1 and the second distance D2 may be equal to each other.

Then, the first target image sensor 420 may image the alignment target T under the target plate 610 and the second target image sensor 520 may image the alignment target T above the target plate 610. The images captured by the first and second target image sensors 420, 520 may be outputted to the controller 700. The controller 700 may perform the alignment of the first and second stages 110, 210 based on the imaging results. For example, in FIGS. 6-9, the first and second stages 110, 210 may be arranged to capture images of the alignment marks, and in FIG. 10 the first and second stages 110, 210 may be re-arranged to image a same target mark to determine a potential imaging error, which then may be applied to the images made in FIGS. 6-9 to adjust for positioning errors.

As illustrated in FIG. 11, an alignment error dx of the second stage 210 may be calculated from the image A2 captured by the second target image sensor 520. The controller 700 may perform alignment of the first and second stages 110 and 210 based on the calculated alignment error dx.

Then, the upper push rod 322 may descend toward the first stage 110 to press the middle portion of the second wafer W2. Thus, the middle portion of the second wafer W2 may be detached from the second surface 212 of the second stage 210 to protrude downwardly more than the peripheral region.

Then, the first and second wafers W1, W2 may be bonded (S150).

As illustrated in FIG. 12, the upper push rod 312 may descend to pressurize or press a middle portion of the second wafer W2. Thus, the middle portion of the second wafer W2 may be detached from the second surface 212 of the second stage 210 to protrude downwardly more than a peripheral region.

When the second wafer W2 bends downwardly such that it is downwardly concave, the first stage 110 may be moved upwardly such that the first wafer W1 contacts the second wafer W2. If a middle portion of the first wafer W1 initially contacts the middle portion of the second wafer W2, the bonding is started.

Figure 13:
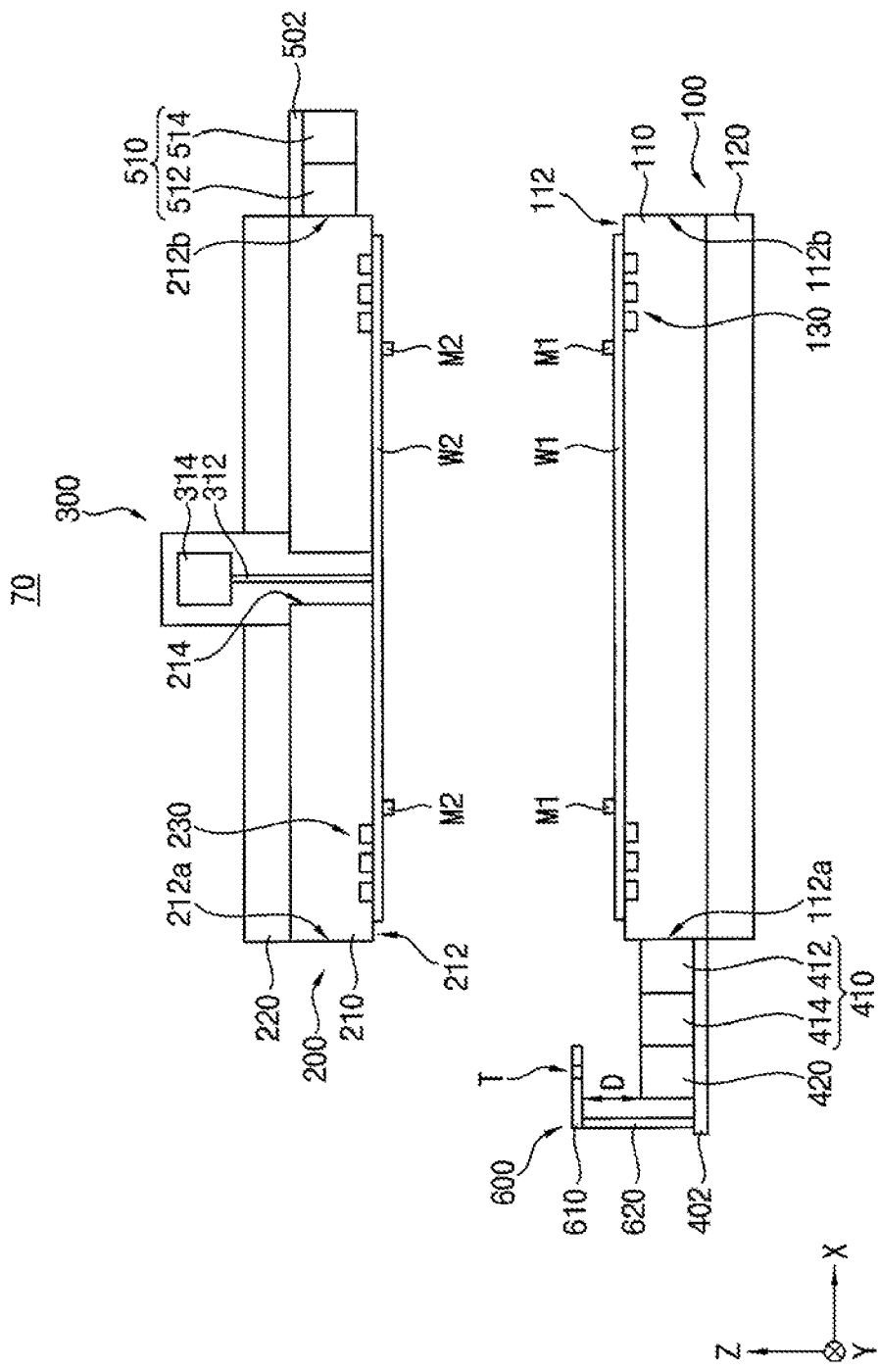
FIG. 13 is a cross-sectional view of a wafer bonding apparatus in accordance with example embodiments.

FIG. 13 is a cross-sectional view of a wafer bonding apparatus in accordance with example embodiments. The wafer bonding apparatus may be substantially the same as or similar to the wafer bonding apparatus described with reference to FIGS. 2 and 3 except for a configuration of an image sensor. Thus, same reference numerals will be used to refer to the same or like elements and any further repetitive explanation concerning the above elements may be omitted.

Referring to FIG. 13, an image sensor of a wafer bonding apparatus may include an alignment mark image sensor for wafer alignment measurement and a target image sensor for stage alignment measurement.

The alignment mark image sensor may include a first mark image sensor 410 in an outer portion of a first stage 110 and configured to image a second alignment mark M2 on a second wafer W2, and a second mark image sensor 510 in an outer portion of a second stage 210 and configured to image a first alignment mark M1 on a first wafer W1. The first mark image sensor 410 may include a first macro camera 412 and a first micro camera 414. The second mark image sensor 510 may include a second macro camera 512 and a second micro camera 514.

The target image sensor may include a first target image sensor 420 in the outer portion of the first stage 110, a second target image sensor in the outer portion of the second stage 210, and a target portion 600 on the first stage 110 and having a target plate 610 fixedly installed to be spaced apart from the first target image sensor 420 by a predetermined distance.

In an implementation, the second mark image sensor 510 may perform a role of the second target image sensor. In an implementation, the second micro camera 514 of the second mark image sensor 510 may serve as the second target image sensor.

In order to perform the alignment measurement of the first and second stages 110, 210, the first and second stages 110 and 210 may be movable so that the first target image sensor 420 and the second micro camera 514 face each other and the target plate 610 is between the first target image sensor 420 and the second micro camera 514 facing each other. In the alignment measurement of the first and second stages 110, 210, the first target image sensor 420 may image an alignment target T under the target plate 610 and the second micro camera 514 may image the alignment target T above the target plate 610.

Hereinafter, a method of aligning stages using the wafer bonding apparatus in FIG. 13 will be described.

Figure 14:
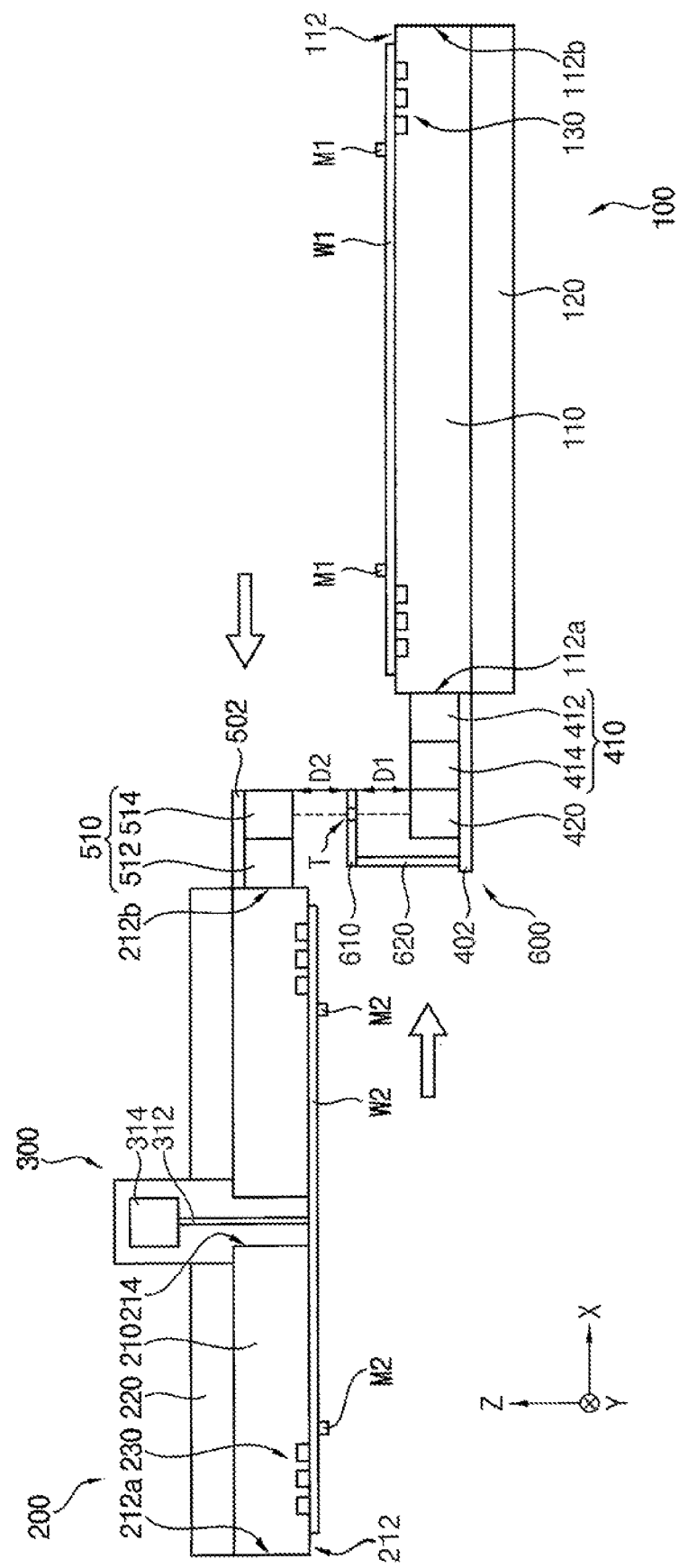
FIG. 14 is a cross-sectional view of a step of imaging a stage alignment target in a wafer to wafer bonding method in accordance with example embodiments.

FIG. 14 is a cross-sectional view of a step of imaging a stage alignment target in a wafer to wafer bonding method in accordance with example embodiments.

Referring to FIG. 14, first and second stages 110, 210 may move relative to each other such that a first target image sensor 420 and a second micro camera 514 face each other. The second micro camera 514 may move to a predetermined imaging position as a position of an alignment target T provided in a target plate 610. Accordingly, the target plate 610 may be between the first target image sensor 420 and the second micro camera 514.

In an implementation, a first distance D1 between the target plate 610 and the first target image sensor 420 and a second distance D2 between the target plate 610 and the second micro camera 514 may be within a range of 5 mm to 15 mm. In an implementation, the first distance D1 and the second distance D2 may be set to be equal to each other.

Then, the first target image sensor 420 may image the alignment target T under the target plate 610 and the second micro camera 514 may image the alignment target T above the target plate 610. The images captured by the first target image sensor 420 and the second micro camera 514 may be outputted to a controller 700. The controller 700 may perform the alignment of the first and second stages 110, 210 based on the imaging results.

The above-described wafer to wafer bonding system and wafer to wafer bonding method may be used to manufacture, e.g., semiconductor packages or image sensors including logic devices and memory devices. In an implementation, the semiconductor packages may include volatile memory devices such as DRAM devices and SRAM devices, or non-volatile memory devices such as flash memory devices, PRAM devices, MRAM devices, ReRAM devices, etc. The image sensor may include a CMOS image sensor.

By way of summation and review, during bonding of wafers to each other, an alignment error could occur between the wafers due to an alignment error between a lower stage and an upper stage for suctioning and holding the wafers.

One or more embodiments may provide an apparatus for bonding wafers to each other.

One or more embodiments may provide a wafer bonding apparatus capable of improving wafer to wafer bonding accuracy.

In the device according to an embodiment, the first target image sensor and the second target image sensor may capture an image or an alignment target of the target plate therebetween to accurately measure a position error between the first and second stages, to thereby minimize an alignment error between wafers in wafer bonding.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wafer bonding apparatus, comprising:
a first stage having a first surface, the first stage being configured to hold a first wafer on the first surface;
a second stage having a second surface, the second stage being configured to hold a second wafer on the second surface, the first surface and the second surface facing each other;
a first target image sensor on an outer portion of the first stage;
a second target image sensor on an outer portion of the second stage;
a target portion on the first stage or the second stage, the target portion having a target plate fixedly installed and spaced apart from the first target image sensor or the second target image sensor by a predetermined distance;
a controller connected to the first target image sensor and the second target image sensor,
wherein, in an alignment measurement of the first stage and the second stage, the first stage and the second stage are movable so that the first target image sensor and the second target image sensor face each other and the target plate is between the first target image sensor and the second target image sensor facing each other, and wherein the controller is configured to control operations of the first stage and the second stage based on results of the alignment measurement of the first stage and the second stage.

2. The wafer bonding apparatus as claimed in claim 1, wherein:
the first target image sensor is on a first outer portion of the first stage, and
the second target image sensor is on a fourth outer portion of the second stage, the fourth outer portion being opposite to a third outer portion of the second stage and the third outer portion being aligned with the first outer portion of the first stage.

3. The wafer bonding apparatus as claimed in claim 1, wherein, in the alignment measurement of the first stage and the second stage, each of a first distance between the target plate and the first target image sensor and a second distance between the target plate and the second target image sensor is within a range of 5 mm to 15 mm.

4. The wafer bonding apparatus as claimed in claim 3, wherein the first distance and the second distance are equal to each other.

5. The wafer bonding apparatus as claimed in claim 1, wherein the target plate includes an alignment target in a plane parallel to the first surface and the second surface.

6. The wafer bonding apparatus as claimed in claim 1, wherein the target portion includes:
a base plate extending outwardly from the outer portion of the first stage or the second stage;
a support plate extending in a vertical direction from the base plate; and
the target plate fixed to the support plate.

7. The wafer bonding apparatus as claimed in claim 1, further comprising:
a first mark image sensor on the outer portion of the first stage, the first mark image sensor being configured to image a second alignment mark on the second wafer; and
a second mark image sensor on the outer portion of the second stage, the second mark image sensor being configured to image a first alignment mark on the first wafer.

8. The wafer bonding apparatus as claimed in claim 7, wherein each of the first mark image sensor and the second mark image sensor includes a macro camera and a micro camera.

9. The wafer bonding apparatus as claimed in claim 7, wherein, when the target portion is fixedly installed on the first stage, the second mark image sensor is also the second target image sensor.

10. A wafer bonding apparatus, comprising:
a first stage configured to suction a first wafer;
a second stage configured to suction a second wafer;
a stage driver configured to move the first stage and the second stage relative to each other;
a first mark image sensor on an outer portion of the first stage, the first mark image sensor being configured to image a second alignment mark on the second wafer;
a second mark image sensor on an outer portion of the second stage, the second mark image sensor being configured to image a first alignment mark on the first wafer;
a target image sensor on the outer portion of the first stage adjacent to the first mark image sensor; and
a target portion on the outer portion of the first stage, the target portion having a target plate arranged above the target image sensor and spaced apart from the target image sensor by a predetermined distance, wherein:
in an alignment measurement of the first stage and the second stage, the first stage and the second stage are movable so that the target image sensor and the second mark image sensor face each other and the target plate is between the target image sensor and the second mark image sensor facing each other, and each of a first distance between the target plate and the target image sensor and a second distance between the target plate and the second mark image sensor is within a range of 5 mm to 15 mm.

11. The wafer bonding apparatus as claimed in claim 10, wherein the first distance and the second distance are equal to each other.

12. The wafer bonding apparatus as claimed in claim 10, wherein:
the first mark image sensor and the target image sensor are on a first outer portion of the first stage, and
the second mark image sensor is on a fourth outer portion of the second stage, the fourth outer portion being opposite to a third outer portion of the second stage and the third outer portion being aligned with the first outer portion of the first stage.

13. The wafer bonding apparatus as claimed in claim 10, wherein the target plate includes an alignment target in a plane parallel to surfaces of the first wafer and the second wafer.

14. The wafer bonding apparatus as claimed in claim 10, wherein the target portion includes:
a base plate extending outwardly from the outer portion of the first stage;
a support plate extending in a vertical direction from the base plate; and
the target plate fixed to the support plate.

15. The wafer bonding apparatus as claimed in claim 10, wherein each of the first mark image sensor and the second mark image sensor includes a macro camera and a micro camera.

16. The wafer bonding apparatus as claimed in claim 10, wherein, in the alignment measurement of the first stage and the second stage, the target image sensor and the second mark image sensor capture an image of an alignment target of the target plate.

17. The wafer bonding apparatus as claimed in claim 10, further comprising:

a push rod that is movable upwardly and downwardly through a center hole in a middle portion of at least one of the first stage and the second stage to press a middle region of the first wafer or the second wafer; and
a push rod driver configured to move the push rod upwardly and downwardly.

18. The wafer bonding apparatus as claimed in claim 10, further comprising a controller connected to the first mark image sensor, the second mark image sensor, and the target image sensor, the controller being configured to control operations of the first stage and the second stage based on results of an alignment measurement of the first wafer and the second wafer obtained by the first mark image sensor and the second mark image sensor and results of the alignment measurement of the first stage and the second stage obtained by the target image sensor and the second mark image sensor.

19. A wafer bonding apparatus, comprising:
a first stage configured to suction a first wafer;
a second stage configured to suction a second wafer;
a stage driver configured to move the first stage and the second stage relative to each other;
a first mark image sensor on an outer portion of the first stage, the first mark image sensor being configured to image a second alignment mark on the second wafer;
a second mark image sensor on an outer portion of the second stage, the second mark image sensor being configured to image a first alignment mark on the first wafer;
a target image sensor in the outer portion of the first stage adjacent to the first mark image sensor;
a target portion on the outer portion of the first stage, the target portion having a target plate arranged above the target image sensor and spaced apart from the target image sensor by a predetermined distance;
a push rod that is movable upwardly and downwardly through a center hole in a middle portion of at least one of the first stage and the second stage to press a middle region of the first wafer or the second wafer; and
a push rod driver configured to move the push rod upwardly and downwardly,
wherein, in an alignment measurement of the first stage and the second stage, the first stage and the second stage are movable so that the target image sensor and the second mark image sensor face each other and the target plate is between the target image sensor and the second mark image sensor facing each other.

* * * * *